United States Patent
Mugler et al.

(10) Patent No.: US 9,891,300 B2
(45) Date of Patent: Feb. 13, 2018

(54) METHOD AND APPARATUS FOR ACQUIRING MAGNETIC RESONANCE DATA

(71) Applicants: Siemens Aktiengesellschaft, Munich (DE); University of Virginia, Charlottesville, VA (US)

(72) Inventors: John Mugler, Charlottesville, VA (US); Dominik Paul, Bubenreuth (DE)

(73) Assignees: University of Virginia Patent Foundation, Charlottesville, VA (US); Siemens Aktiengesellschaft, Munich (DE)

( * ) Notice: Subject to any disclaimer, the term of this patent is extended or adjusted under 35 U.S.C. 154(b) by 477 days.

(21) Appl. No.: 14/464,945

(22) Filed: Aug. 21, 2014

(65) Prior Publication Data

US 2016/0054411 A1   Feb. 25, 2016

(51) Int. Cl.
*G01R 33/483* (2006.01)
*G01R 33/48* (2006.01)
*G01R 33/561* (2006.01)

(52) U.S. Cl.
CPC ..... *G01R 33/4824* (2013.01); *G01R 33/4833* (2013.01); *G01R 33/5617* (2013.01)

(58) Field of Classification Search
CPC ............ G01R 33/4824; G01R 33/4833; G01R 33/5617
See application file for complete search history.

(56) References Cited

U.S. PATENT DOCUMENTS

| | | | | |
|---|---|---|---|---|
| 5,019,784 A | * | 5/1991 | Garwood | G01R 33/446 324/307 |
| 2003/0052672 A1 | | 3/2003 | Speier et al. | |
| 2006/0184002 A1 | * | 8/2006 | Yarnykh | G01R 33/5607 600/410 |
| 2006/0253015 A1 | * | 11/2006 | Nezafat | G01R 33/5635 600/410 |
| 2009/0230957 A1 | * | 9/2009 | Park | A61B 5/055 324/307 |
| 2010/0001727 A1 | * | 1/2010 | Frydman | G01R 33/4822 324/310 |
| 2010/0013479 A1 | * | 1/2010 | Park | G01R 33/54 324/309 |
| 2010/0045290 A1 | | 2/2010 | Miyoshi | |

(Continued)

OTHER PUBLICATIONS

Improved T2-weighted imaging of the pelvis using T2-prepared single-slab 3D TSE (SPACE), Proc. Intl. Soc. Mag. Reson. Med. 19 (2011).*

Mugler et al: "Inner-volume 3D Turbo-spin-echo (SPACE) Imaging of the Prostate: Preliminary Experience"; Proceedings of the International Society for Magnetic Resonance in Medicine; 20th Annual Meeting & Exhibition; p. 3027; (2012).

(Continued)

*Primary Examiner* — G. M. Hyder

(74) *Attorney, Agent, or Firm* — Schiff Hardin LLP

(57) ABSTRACT

In a method and apparatus for magnetic resonance data acquisition, data are acquired according to a single-slab three-dimensional turbo or fast spin-echo pulse sequence, wherein the inner volume selection in the phase-encoding direction takes place by radiating a pair of adiabatic RF pulses, instead of the single refocusing RF pulse that is conventional. The radiation of the adiabatic RF pulses allows a high RF pulse bandwidth to be achieved, for a given limit on the peak radio-frequency field strength. Such a high RF pulse bandwidth reduces off-resonance-related artifacts.

20 Claims, 6 Drawing Sheets

(56) References Cited

U.S. PATENT DOCUMENTS

| | | |
|---|---|---|
| 2012/0112745 A1 | 5/2012 | Takizawa et al. |
| 2012/0194186 A1 | 8/2012 | Rehwald et al. |
| 2012/0194187 A1* | 8/2012 | Rehwald ............ G01R 33/5602 |
| | | 324/309 |
| 2013/0342202 A1* | 12/2013 | Mugler ............ G01R 33/56509 |
| | | 324/309 |

OTHER PUBLICATIONS

Park et al: "Reduction of B1 Sensitivity in Selective Single-Slab 3D Turbo Spin Echo Imaging with Very Long Echo Trains"; Magnetic Resonance in Medicine, vol. 62 pp. 1060-1066; (2009).

Scheenen et al: "Towards 1H-MRSI of the human brain at /T with slice-selective adiabatic refocusing pulses"; Magnetic Resonance Materials in Physics, Biology and Medicine, Chapman and Hall, London; vol. 21 No. 1-2; pp. 95-101; (2008).

Gröhn et al: "Adiabatic inner volume selection (IVS) method for high resolution 3D MRI"; Proceedings of the international Society for Magnetic Resonance in Medicine; 11th Scientific Meeting & Exhibition; p. 960; (2003).

Fielden et al: "Variable-flip angle 3D-turbo spin echo imaging utilizing spiral acquisitions"; Proceedings of the international Society for Magnetic Resonance ih Medicine; 19th Annual Meeting & Exhibition Montreal Canada; p. 2020; (2011).

De Graaf et al: "Adiabatic RARE imaging"; NMR in Biomedicine, vol. 16 No. 1; pp. 29-35; (2003).

Feinberg et al. "Inner Volume MR Imaging: Technical Concepts and Their Application," Radiology, vol. 156, pp. 743-747 (1985).

\* cited by examiner

METHOD AND APPARATUS FOR ACQUIRING MAGNETIC RESONANCE DATA

BACKGROUND OF THE INVENTION

The present invention concerns a method to acquire magnetic resonance data, as well as a magnetic resonance system, and an electronically readable data storage medium.

DESCRIPTION OF THE PRIOR ART

Magnetic resonance (MR) is a known modality with which images of the inside of an examination subject can be generated. Expressed in a simplified manner, for this purpose the examination subject, in the opening of a magnetic resonance apparatus, is positioned in a strong, static, homogeneous basic magnetic field (also called a $B_0$ field) with a field strength of 0.2 to 7 Tesla or more, such that nuclear spins in the subject orient preferentially along the basic magnetic field. Radio-frequency (RF) excitation pulses and possibly refocusing pulses are radiated into the examination subject to elicit magnetic resonance signals, which are detected and entered as data values into an electronic memory, in an organized manner that represents a domain known as k-space, such as a matrix. On the basis of the k-space data, MR images are reconstructed or spectroscopy data are determined. Rapidly switched (activated) magnetic gradient fields may be superimposed on the basic magnetic field for spatial encoding of the magnetic resonance data (measurement data). The acquired measurement data are digitized and stored as complex numerical values in a k-space matrix. For example, by means of a multidimensional Fourier transformation, an associated MR image can be reconstructed from the k-space matrix populated with values.

The aforementioned radio-frequency pulses and gradient fields are activated in the magnetic resonance apparatus according to various schemes, known as pulse sequences, with which the data acquisition unit is operated. Highly sophisticated spin-echo pulse sequences include single-slab three-dimensional (3D) turbo or fast spin-echo (hereafter 3D-TSE/FSE) pulse sequences known as, among other names, SPACE (Sampling Perfection with Application optimized Contrasts using different flip angle Evolutions). Pulse sequences of this type allow an extremely large number of refocusing RF pulses (e.g., more than 300), and may use a refocusing RF pulse train that exhibits pulses with mostly constant flip angles, or that exhibits pulses with respectively different flip angles of less than 180°, throughout the duration of the echo train. In the latter case, the values of the flip angles for the RF pulse train are selected so as to achieve desired signal strengths for different types of tissue, and are referred to as a flip angle evolution. Thus, this implementation of a 3D-TSE/FSE pulse sequence uses application-specific variable flip angles.

In order to reduce the field of view in the phase-encoding direction, without causing infolding artifacts (also known as aliasing or wrap-around artifacts), it is known to make use of an inner-volume selection scheme for "zoomed" 3D-TSE/FSE imaging. The RF field that is generated by the radio-frequency pulses is called the B1 field, and due to technical limitations of the RF transmission system in conventional MR systems, the maximum (peak) B1 field that can be applied requires that a compromise be made with regard to the first refocusing RF pulse in the 3D-TSE/FSE pulse sequence, which is used for selecting the inner volume. Specifically, it is necessary to use a longer RF pulse duration for this first refocusing RF pulse than would otherwise be desired, which results in a relatively low bandwidth for the RF pulse. Consequently, the conventional zoomed 3D-TSE/FSE pulse sequence exhibits a high sensitivity to off-resonance effects, such as chemical-shift misregistration, or geometric distortion due to inhomogeneity of the static magnetic field (basic magnetic field) that is generated in the MR system.

SUMMARY OF THE INVENTION

An object of the present invention is to provide a method for acquiring magnetic resonance data according to a 3D-TSE/FSE pulse sequence using an inner-volume selection scheme, wherein the aforementioned disadvantages are avoided, or at least alleviated. A further object of the invention is to provide a magnetic resonance apparatus that operates according to such a method, as well as a non-transitory, computer-readable data storage medium encoded with programming instructions that cause a magnetic resonance apparatus to be operated according to such a method.

In the aforementioned 3D-TSE/FSE pulse sequence, it is conventional to achieve the inner-volume selection in the (in-plane) phase-encoding direction by radiating a single refocusing RF pulse, such a sinc-shaped and SLR-designed RF pulse. The present inventors have had the insight to realize that this conventional configuration of the single refocusing RF pulse is a source of the aforementioned disadvantages associated with the conventional 3D-TSE/FSE pulse sequence. In accordance with the present invention, in such a 3D-TSE/FSE pulse sequence, the single refocusing RF pulse is replaced with a pair of adiabatic RF pulses, in order to achieve the inner-volume selection in the phase-encoding direction.

The adiabatic RF pulses allow a high RF pulse bandwidth, for a given limit on the peak B1 field, to be achieved.

Tests conducted using an adiabatic pulse pair in a 3D-TSE/FSE pulse sequence have shown that at least 70% higher bandwidth can be achieved, compared to the best non-adiabatic RF pulse that has been conventionally used. The high RF pulse bandwidth reduces the aforementioned off-resonance-related artifacts by a corresponding amount. It is expected that, if such adiabatic RF pulses are applied in conjunction with a constant magnetic field gradient, it is also possible to use variable-excitation-rate adiabatic pulses in order to achieve even higher RF pulse bandwidths, for a given peak B1 field.

Multiple pairs of adiabatic RF pulses can be used to achieve spatial selection along two (versus one) directions. At least two different variants can achieve this result.

In a first variant, selective excitation of nuclear spins along a slice axis takes place, and inner volume-selective refocusing takes place along the (in-plane) phase-encoding axis and the readout axis. This variant is useful for the implementation of the 3D-TSE/FSE pulse sequence using non-Cartesian k-space trajectories, such as a radial trajectory or a spiral trajectory.

In a second embodiment, non-selective excitation of nuclear spins takes place, with inner volume-selective refocusing along the slice axis and along the (in-plane) phase-encoding axis. This is useful for combining the 3D-TSE/FSE pulse sequence with an adiabatic excitation (which may be non-selective, due to technical limitations).

In accordance with the invention, a pair (or other even number) of adiabatic RF pulses is used for the inner volume selection in 3D-TSE/FSE imaging, in combination with conventional slab selection and data acquisition. As noted above, this selection can take place along more than one axis in 3D-TSE/FSE imaging by the use of multiple pairs of adiabatic RF pulses.

By achieving a higher pulse bandwidth at a given peak B1 field, by virtue of the radiation of the adiabatic RF pulses, reduced off-resonance effects are achieved, and oversampling can be reduced in order to save data acquisition time.

DESCRIPTION OF THE PREFERRED EMBODIMENTS

Figure 1:
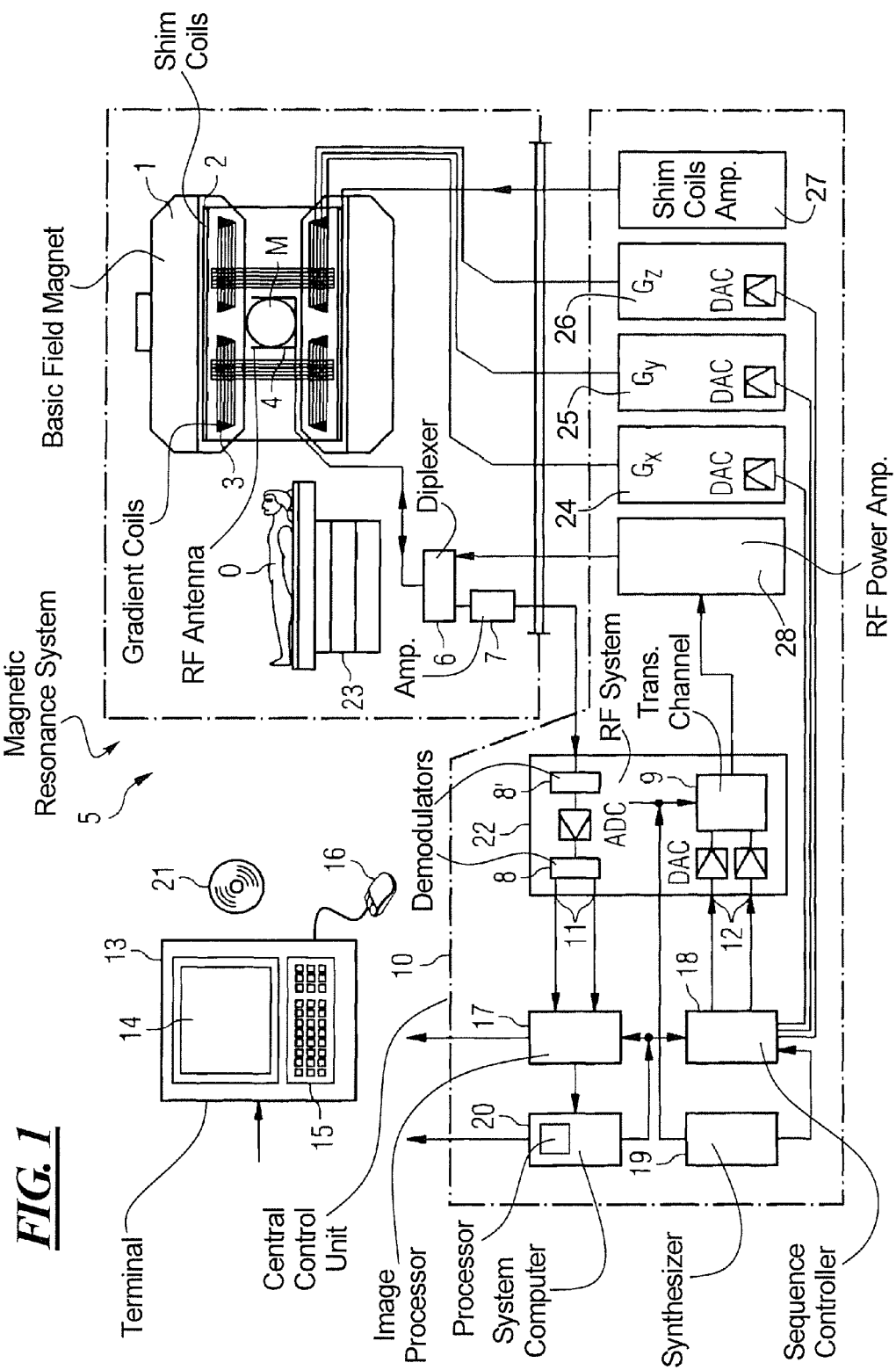
FIG. 1 is a block diagram that schematically illustrates an exemplary magnetic resonance system constructed and operating in accordance with the present invention.

FIG. 1 shows a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in a selected region O of an examination subject U, for example of a part of a human body that is to be examined. The subject U lies on a table 23 and is examined in the magnetic resonance system 5. The high homogeneity of the basic magnetic field that is required for the magnetic resonance measurement is defined in a typically (but not necessarily) spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2, operated by shim coils amplifier 26.

A cylindrical gradient coil system 3 composed of three sub-windings is used in the basic field magnet 1. Each sub-winding is supplied with current by an amplifier to generate, for example, a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is activated by a sequence controller 18 for accurately-timed generation of gradient pulses.

Located within the gradient field system 3 are one (or more) radio-frequency antennas 4—in particular at least one multichannel RF transmission coil and at least one RF reception coil—that convert the radio-frequency pulses emitted by a radio-frequency power amplifier 27 into an alternating magnetic field for excitation of the nuclei and alignment of the nuclear spins of the examination subject U to be examined, or of the region of the selected region O of the examination subject U that is to be examined. Each radio-frequency antenna 4 is composed of one or more RF transmission coils and multiple RF reception coils in the form of an annular—preferably linear or matrix-like—arrangement of component coils. The alternating field emanating from the precessing nuclear spins—i.e. normally the spin echo signals caused by a pulse sequence composed of one or more radio-frequency pulses and one or more gradient pulses—is also converted by the RF reception coils of the respective radio-frequency antenna 4 into a voltage (measurement signal). This signal is supplied via an amplifier 7 to a radio-frequency reception channel 8 of a radio-frequency system 22. The radio-frequency system 22 furthermore has a transmission channel 9 in which the radio-frequency pulses are generated for the excitation of the magnetic resonance. The respective radio-frequency pulses are digitally represented in the sequence controller 18 as a series of complex numbers based on a pulse sequence predetermined by the system computer 20 that has a processor 24 to determine flip angles adapted from a predetermined signal curve. This number sequence is supplied as a real part and an imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. A planar or three-dimensional MR image data set can be reconstructed by an image computer 17 from the measurement data acquired in such a manner. The image computer in particular has a processor 25 with which magnetic resonance data that may not have been acquired can be supplemented by means of known methods (such as half Fourier or partial Fourier methods) and/or magnetic resonance data that are acquired multiple times can be processed into a data set. The administration of the measured magnetic resonance data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals.

The time base for the radio-frequency system 22 and the sequence controller 18 is provided by a synthesizer 19. The selection of appropriate control programs to generate an acquisition of magnetic resonance data (which programs are stored on a DVD 21, for example), the selection of a selected region O that should be excited and from which magnetic resonance data should be received, the specification of a substance with which the selected region O is filled to determine the flip angles for the desired signal curve, and the presentation of a generated MR image take place via a terminal 13. The terminal 13 may have a keyboard 15, a mouse 16 and a monitor 14, with which an operator can make appropriate entries in order to select a pulse sequence, in the form of an operating protocol, such as the 3D-TSE/FSE pulse sequence in accordance with the present invention.

Figure 2:
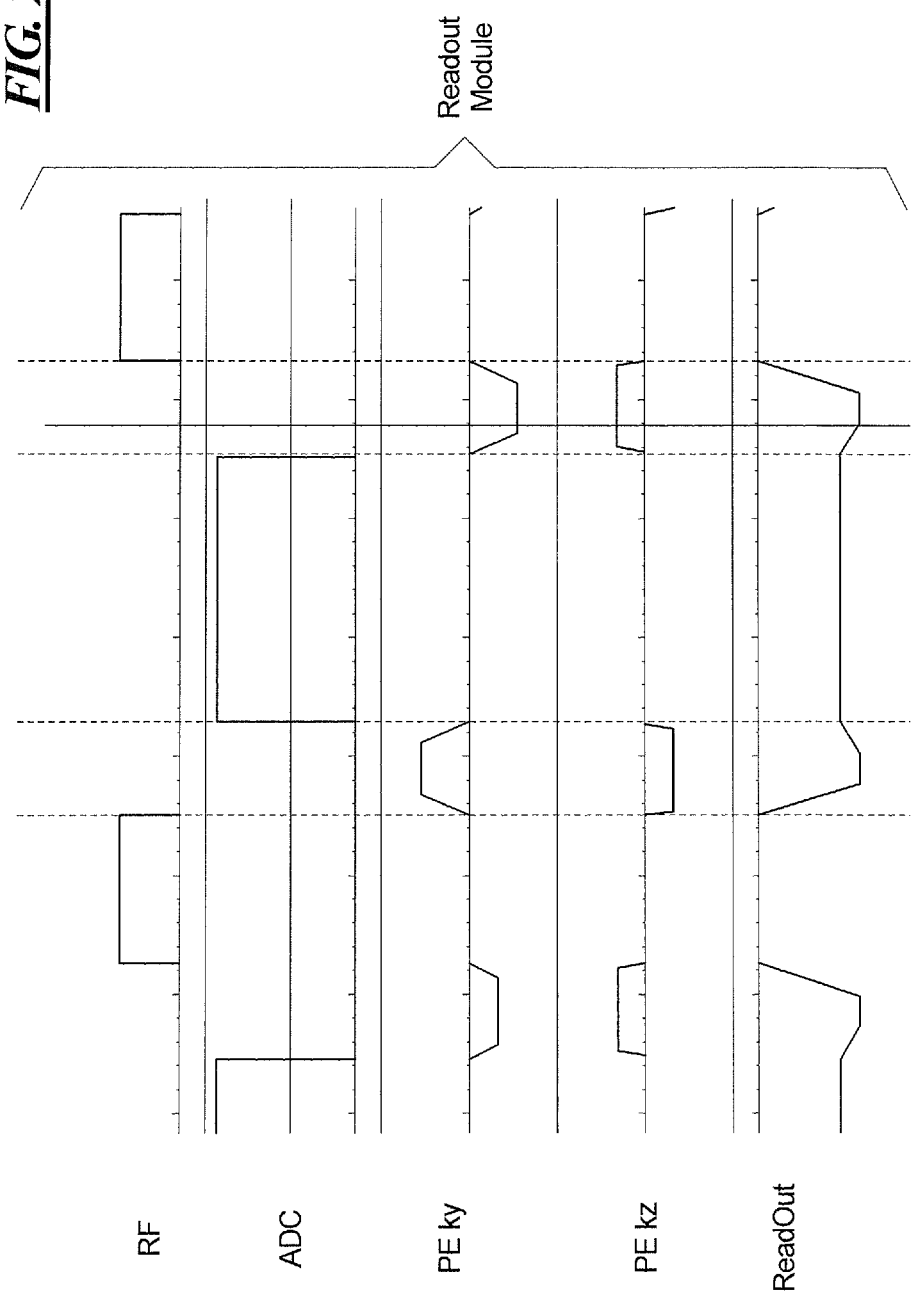
FIG. 2 schematically illustrates a readout module for use in reading out magnetic resonance data in all embodiments of the invention.

FIG. 2 schematically illustrates a readout module that can be used to readout magnetic resonance data in all embodiments of the invention. The readout module includes an RF pulse, and the magnetic resonance signal is the output of the analog-to-digital converter (ADC). In addition to the readout gradient (ReadOut) along the logical x-axis (bottom of FIG. 2), two phase-encoding (PE) gradients are used, one for encoding along the logical y-axis of k-space (PE ky; in-plane phase encoding) and another for encoding along the z-axis of k-space (PE kz; through-plane phase encoding).

Figure 3:
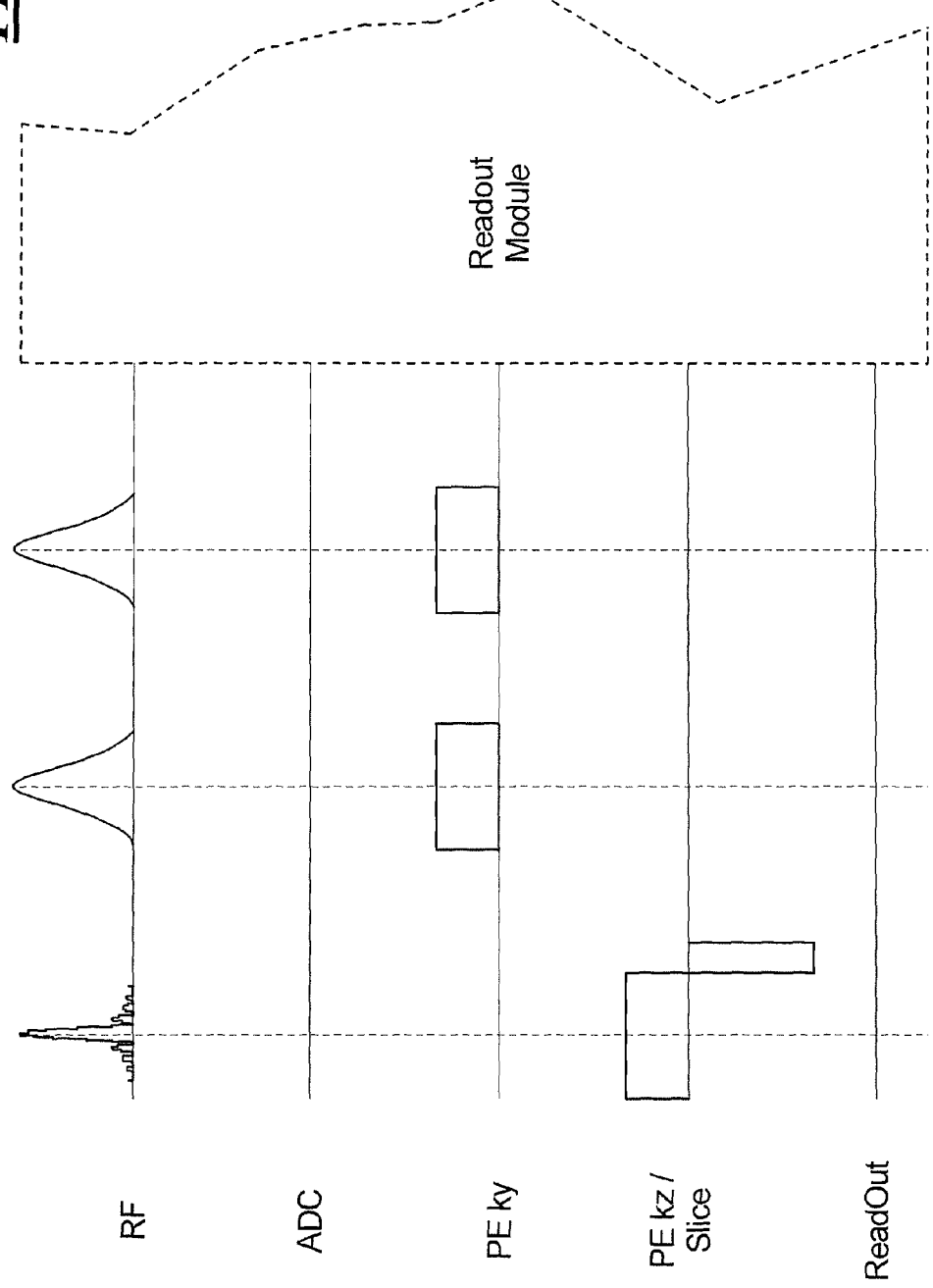
FIG. 3 schematically illustrates the 3D-TSE/FSE pulse sequence in accordance with the invention, with at least a pair of adiabatic RF pulses for inner volume selection.

A basic embodiment of the pulse sequence according to the invention is shown in FIG. 3, which is a modified version of the known 3D-TSE/FSE pulse sequence in which, as shown in FIG. 3, at least a pair of adiabatic RF pulses are radiated, in place of the conventional single inner-volume selection RF pulse that has previously been used.

The sequence shown in FIG. 3 is followed by the readout module that is shown in FIG. 2, and for this reason respective lines are indicated for the ADC and the readout gradient, even though those events occur only in the readout module, and no events exist on those lines in the portion of the pulse sequence that is shown in FIG. 3.

FIG. 3 also shows the aforementioned phase-encoding gradients, and in the case of FIG. 3 a slice-selection gradient is also applied along the PE kz direction. In FIG. 3, as is conventional in a 3D-TSE/FSE pulse sequence, the inner-volume selection takes place along only one axis.

Figure 4:
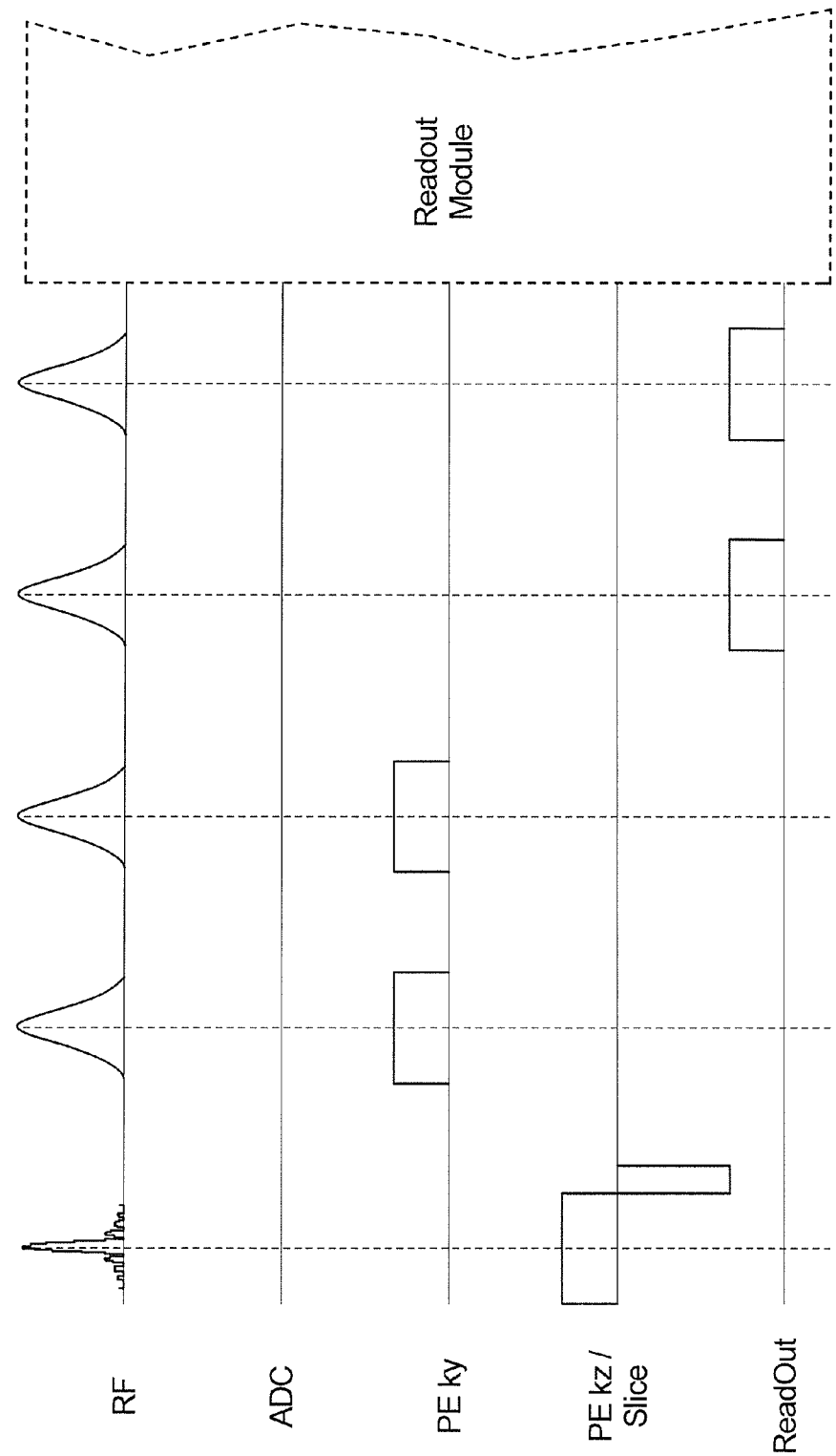
FIG. 4 is a pulse diagram of a first embodiment of the invention for achieving spatial selection of the inner volume along two directions.

FIG. 4 schematically illustrates a first embodiment in accordance with the invention, wherein selection of the inner volume takes place in two directions. In the embodiment shown in FIG. 4, in addition to the aforementioned slice-selection gradient along the PE kz axis, selection of the volume to be encoded also takes place by radiating an adiabatic RF-pulse pair in conjunction with gradient pulses along the readout (logical x) axis. This embodiment is particularly useful for implementation of the 3D-TSE/FSE pulse sequence wherein the raw magnetic resonance data are entered into a memory organized as k-space along a non-Cartesian trajectory. Such a non-Cartesian trajectory can be, for example, a radial trajectory or a spiral trajectory.

Figure 5:
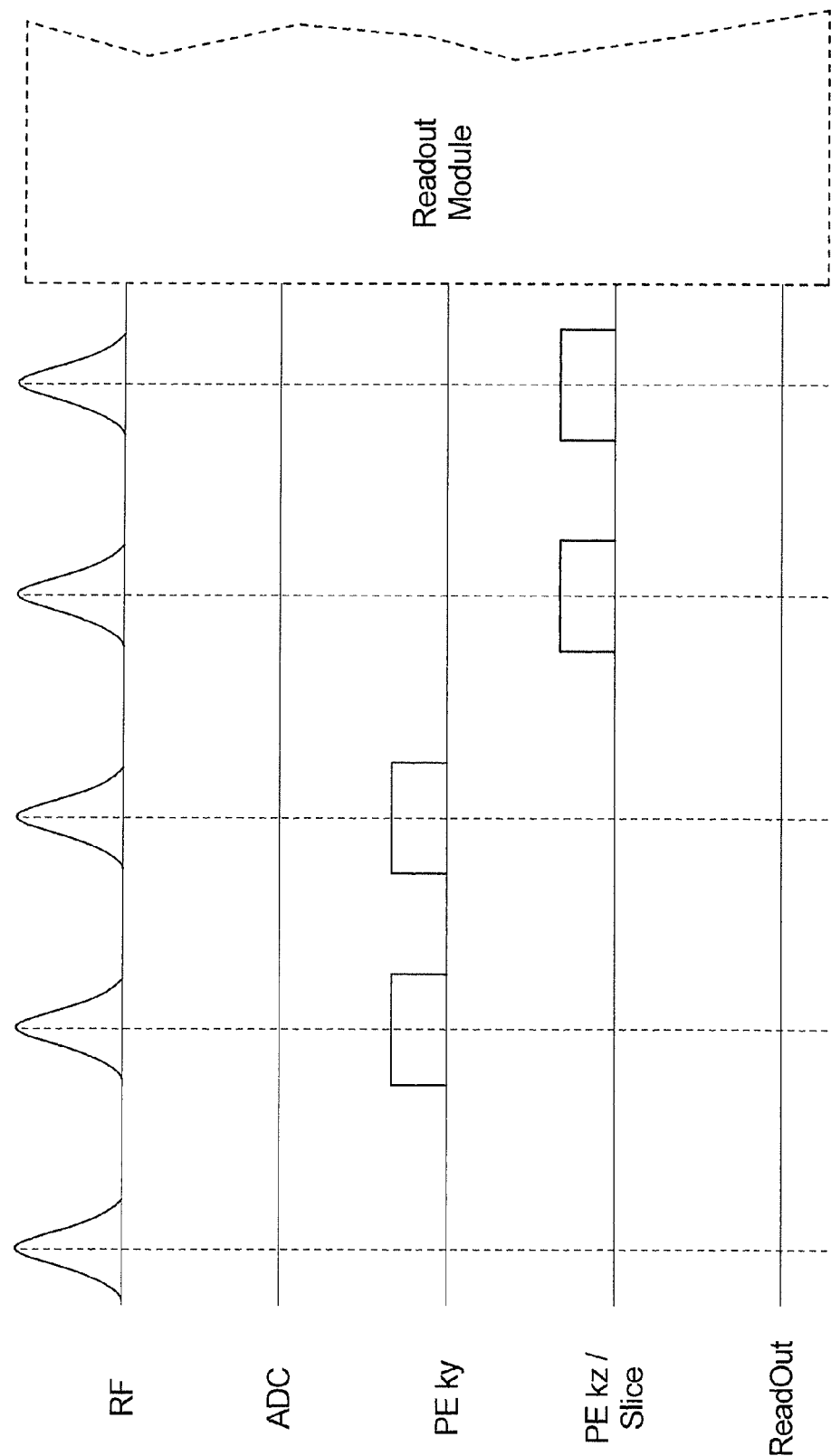
FIG. 5 is a pulse diagram of a second embodiment of the invention for achieving spatial selection of the inner volume along two directions.

FIG. 5 is a pulse sequence that illustrates another embodiment in accordance with the invention for inner-volume selection along two directions. In the embodiment shown in FIG. 5, selection of the volume takes place not only along the aforementioned PE kz direction, but also along the PE ky direction. This embodiment is useful for combining the 3D-TSE/FSE pulse sequence with an adiabatic excitation, which is non-selective.

Figure 6:
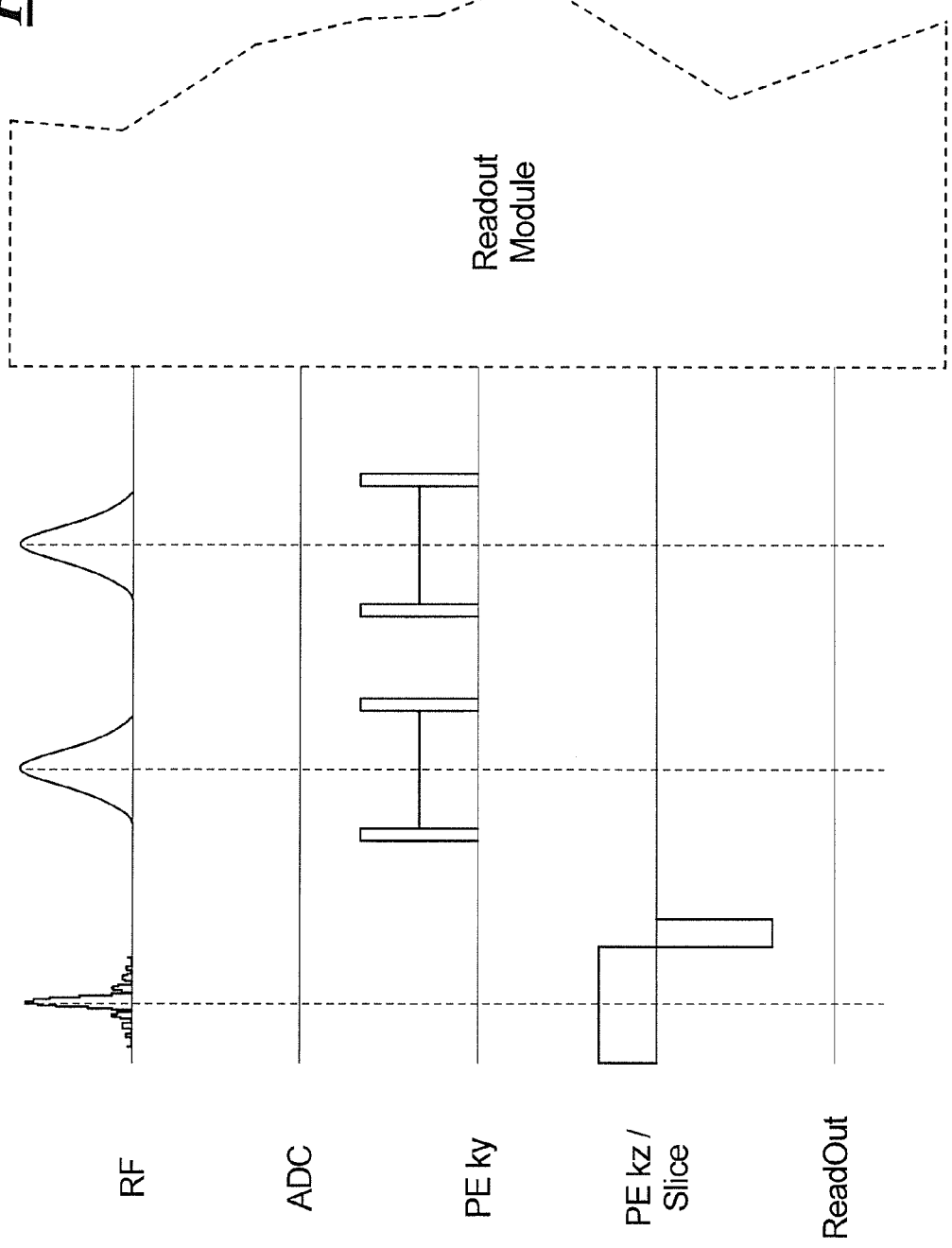
FIG. 6 schematically illustrates a variation of the embodiment of the 3D-TSE/FSE pulse sequence shown in FIG. 3, with spoiler gradients.

FIG. 6 shows a version of the embodiment of FIG. 3 wherein spoiler gradients are activated preceding and following the phase encoding gradients PE.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data from a subject comprising:
    with a control computer, operating an MR data acquisition unit, in which a subject is situated, according to a single-slab three-dimensional turbo spin-echo pulse sequence, in order to acquire raw MR data from the subject;
    in said pulse sequence, selecting an inner volume of the subject in order to acquire said raw MR data only from said inner volume, by activating a first gradient field in a first direction and activating a second gradient field in a second direction that is not aligned with said first direction;
    in said pulse sequence, exciting nuclear spins of the subject in said inner volume by radiating a radio-frequency (RF) excitation pulse followed by at least one adiabatic RF pulse pair, with at least one of said RF excitation pulse and said at least one adiabatic pulse pair being respectively simultaneously activated with one of said first and second gradient fields, with said inner volume being defined by at least the first and second directions and the respectively simultaneously radiated RF pulses; and
    providing said raw MR data to a control computer and, via said control computer, entering said raw MR data into an electronic memory organized as k-space, thereby producing k-space data in said electronic memory and, via said control computer, making said k-space data available in electronic form as a data file from said control computer.

2. A method as claimed in claim 1 comprising providing said k-space data from said control computer to an image reconstruction computer and, in said image reconstruction computer, reconstructing image data, depicting said inner volume, from said k-space data.

3. A method as claimed in claim 1 comprising, via said control computer, entering said raw MR data into said electronic memory organized as k-space along a non-Cartesian trajectory in k-space.

4. A method as claimed in claim 3 comprising selecting said non-Cartesian k-space trajectory from the group consisting of a radial trajectory and a spiral trajectory.

5. A method as claimed in claim 1 comprising, with said control computer, operating said MR data acquisition unit according to a Sampling Perfection with Application optimized Contrasts using different flip angle Evolutions (SPACE) sequence, as said pulse sequence.

6. A method as claimed in claim 1 comprising activating said RF excitation pulse as a non-adiabatic pulse during activation of said first gradient field, and activating said at least one adiabatic RF pulse pair during activation of said second gradient field.

7. A method as claimed in claim 6 comprising radiating only one adiabatic RF pulse pair, and activating said second gradient field as two individual second gradient field pulses respectively occurring simultaneously with respective adiabatic RF pulses in said one adiabatic RF pulse pair.

8. A method as claimed in claim 7 comprising, in said pulse sequence, also activating spoiler gradients respectively before and after each individual second gradient field pulse.

9. A method as claimed in claim 6 comprising activating said first gradient field as a slice selection gradient field and activating said second gradient field as a phase encoding gradient field.

10. A method as claimed in claim 1 comprising, in said pulse sequence:
- radiating said RF excitation pulse as a non-adiabatic RF pulse during activation of said first gradient field;
- radiating two adiabatic RF pulse pairs comprising a first adiabatic RF pulse pair followed by a second adiabatic RF pulse pair;
- activating said second gradient field as two individual second gradient field pulses respectively occurring simultaneously with adiabatic RF pulses in said first adiabatic RF pulse pair;
- activating a third gradient field in a third direction that is not aligned with either of said first and second directions and thereby further defining said inner volume; and
- activating said third gradient field as two individual third gradient field pulses respectively occurring simultaneously with adiabatic RF pulses in said second adiabatic RF pulse pair.

11. A method as claimed in claim 10 comprising activating said first gradient field as a slice selection gradient field, activating said second gradient field as a phase encoding gradient field, and activating said third gradient field as a readout gradient field.

12. A method as claimed in claim 1 comprising, in said pulse sequence:
- radiating said RF excitation pulse as an adiabatic excitation pulse with no gradient field being activated during said adiabatic RF excitation pulse;
- radiating two adiabatic RF pulse pairs comprising a first adiabatic pulse pair followed by a second adiabatic pulse pair;
- activating said first gradient field as two individual gradient field pulses respectively occurring during respective adiabatic RF pulses of said first adiabatic pulse pair; and
- activating said second gradient field as two individual second gradient field pulses respectively occurring during adiabatic RF pulses of said second adiabatic RF pulse pair.

13. A method as claimed in claim 12 comprising activating said first gradient field as a phase encoding gradient field and activating said second gradient field as a slice selection gradient field.

14. A magnetic resonance (MR) apparatus comprising:
- an MR data acquisition unit comprising at least one radio-frequency (RF) radiator and a gradient coil arrangement;
- a control computer configured to operate said MR data acquisition unit, while a subject is situated therein, according to a single-slab three-dimensional turbo spin-echo pulse sequence, in order to acquire raw MR data from the subject;
- said control computer being configured to operate said MR data acquisition unit in said pulse sequence in order to select an inner volume of the subject so as to acquire said raw MR data only from said inner volume, by operating said gradient coil arrangement so as to activate a first gradient field in a first direction and activating a second gradient field in a second direction that is not aligned with said first direction;
- said control computer being configured to operate said MR data acquisition unit in said pulse sequence in order to excite nuclear spins of the subject in said inner volume by operating said RF radiator so as to radiate an RF excitation pulse followed by at least one adiabatic RF pulse pair, with at least one of said RF excitation pulse and said at least one adiabatic pulse pair being respectively simultaneously activated with one of said first and second gradient fields, with said inner volume being defined by at least the first and second directions and the respectively simultaneously radiated RE pulses;
- an electronic memory; and
- said control computer being configured to enter said raw MR data into said electronic memory organized as k-space, thereby producing k-space data in said electronic memory, and to make said k-space data available in electronic form as a data file from said control computer.

15. An MR apparatus as claimed in claim 14 wherein said control computer is configured to enter said raw MR data into said electronic memory organized as k-space along a non-Cartesian trajectory in k-space.

16. An MR apparatus as claimed in claim 14 wherein said control computer is configured to operate said MR data acquisition unit according to a Sampling Perfection with Application optimized Contrasts using different flip angle Evolutions (SPACE) sequence, as said pulse sequence.

17. An MR apparatus as claimed in claim 14 wherein said control computer is configured to operate said MR data acquisition unit in said pulse sequence in order to activate said RF excitation pulse as a non-adiabatic pulse during activation of said first gradient field, and to activate said at least one adiabatic RF pulse pair during activation of said second gradient field.

18. An MR apparatus as claimed in claim 14 wherein said control computer is configured to operate said MR data acquisition unit in said pulse sequence in order to:
- radiate said RF excitation pulse as a non-adiabatic RF pulse during activation of said first gradient field;
- radiate two adiabatic RE pulse pairs comprising a first adiabatic RE pulse pair followed by a second adiabatic RF pulse pair;
- activate said second gradient field as two individual second gradient field pulses respectively occurring simultaneously with adiabatic RF pulses in said first adiabatic RF pulse pair;
- activate a third gradient field in a third direction that is not aligned with either of said first and second directions and thereby further defining said inner volume; and
- activate said third gradient field as two individual third gradient field pulses respectively occurring simultaneously with adiabatic RF pulses in said second adiabatic RF pulse pair.

19. An MR apparatus as claimed in claim 14 wherein said control computer is configured to operate said MR data acquisition unit in said pulse sequence in order to:
- radiate said RF excitation pulse as an adiabatic excitation pulse with no gradient field being activated during said adiabatic RE excitation pulse;
- radiate two adiabatic RF pulse pairs comprising a first adiabatic pulse pair followed by a second adiabatic pulse pair;
- activate said first gradient field as two individual gradient field pulses respectively occurring during respective adiabatic RF pulses of said first adiabatic pulse pair; and
- activate said second gradient field as two individual second gradient field pulses respectively occurring during adiabatic RF pulses of said second adiabatic RF pulse pair.

20. A non-transitory, computer-readable data storage medium encoded with programming instructions, said storage medium being loaded into a control and processing computer system of a magnetic resonance (MR) apparatus that also comprises an MR data acquisition unit, said programming instructions causing said control and processing system computer to:

operate said MR data acquisition unit, while a subject is situated therein, according to a pulse sequence a single-slab three-dimensional turbo spin-echo pulse sequence, in order to acquire raw MR data from the subject;

operate said MR data acquisition unit in said pulse sequence in order to select an inner volume of the subject so as to acquire said raw MR data only from said inner volume, by activating a first gradient field in a first direction and activating a second gradient field in a second direction that is not aligned with said first direction;

operate said MR data acquisition unit in said pulse sequence in order to excite nuclear spins of the subject in said inner volume by radiating a radio-frequency (RF) excitation pulse followed by at least one adiabatic RF pulse pair, with at least one of said RF excitation pulse and said at least one adiabatic pulse pair being respectively simultaneously activated with one of said first and second gradient fields, with said inner volume being defined by at least the first and second directions and the respectively simultaneously radiated RF pulses; and enter said raw MR data into an electronic memory organized as k-space, thereby producing k-space data in said electronic memory, and make said k-space data available in electronic form as a data file from said control computer.

* * * * *